(12) United States Patent
Tachibana et al.

(10) Patent No.: US 7,987,742 B2
(45) Date of Patent: Aug. 2, 2011

(54) TRANSPORTATION APPARATUS AND TENSION ADJUSTMENT METHOD OF BELT IN THE SAME

(75) Inventors: Sachio Tachibana, Aichi (JP); Yasushi Taniyama, Aichi (JP)

(73) Assignee: Shinko Electric Co., Ltd., Tokyo (JP)

( * ) Notice: Subject to any disclaimer, the term of this patent is extended or adjusted under 35 U.S.C. 154(b) by 879 days.

(21) Appl. No.: 12/003,332

(22) Filed: Dec. 21, 2007

(65) Prior Publication Data

US 2008/0152465 A1     Jun. 26, 2008

(30) Foreign Application Priority Data

Dec. 22, 2006  (JP) ................. P2006-345390

(51) Int. Cl.
*B25J 17/00* (2006.01)
*B25J 18/00* (2006.01)

(52) U.S. Cl. ............... 74/490.01; 74/490.04; 74/490.05; 901/21; 901/28

(58) Field of Classification Search ............... 74/490.01, 74/490.03, 490.04, 490.05, 501.5 R; 414/744.5; 901/15, 21, 23, 28
See application file for complete search history.

(56) References Cited

U.S. PATENT DOCUMENTS

| | | | | |
|---|---|---|---|---|
| 3,448,633 | A | * | 6/1969 | Jackoboice ............... 74/501.5 R |
| 5,151,008 | A | * | 9/1992 | Ishida et al. ............... 414/744.5 |
| 5,577,879 | A | * | 11/1996 | Eastman et al. .......... 414/744.5 |
| 6,276,892 | B1 | * | 8/2001 | Haraguchi et al. ......... 414/744.5 |

FOREIGN PATENT DOCUMENTS

JP          4-331090          11/1992

* cited by examiner

*Primary Examiner* — Thomas R Hannon
*Assistant Examiner* — Phillip A Johnson
(74) *Attorney, Agent, or Firm* — Jean C. Edwards, Esq.; Edwards Neils PLLC

(57) ABSTRACT

A transportation apparatus operable to linearly transport an object includes a first transmission unit provided in a first intermediate table and which is operable to transmit torque from one of a pair of first links to one of a pair of second links. The transmission unit includes a pair of pulleys supported by a pair of first intermediate shafts and fixed to the one of the first links and the one of the second links; and an upper belt and lower belt are partially wound around the pulley in opposite directions with each other and fixed to the pulleys so as to transmit the torque. One of the pulley is divided into an upper part fixed with the upper belt and a lower fixed with the lower belt in an axial direction of the first intermediate shafts.

4 Claims, 13 Drawing Sheets

TRANSPORTATION APPARATUS AND TENSION ADJUSTMENT METHOD OF BELT IN THE SAME

BACKGROUND

The present invention relates to a transportation apparatus in which first and second linkages are coupled to each other to linearly transport an object such as a wafer, and a tension adjustment method of a belt in the transportation apparatus.

For example, there is a known transportation apparatus in Patent Document 1. The transportation apparatus for linearly transporting the object includes a first linkage in which base ends of a pair of first links which have the same length with each other are pivotably coupled to a fixed table through a pair of first coupling shafts, and tip ends of the pair of first links are pivotably coupled to a pair of intermediate shafts which are fixed to a pair of intermediate tables; a second linkage in which base ends of a pair of second links which have the same length with the first links are pivotably coupled to the pair of intermediate shafts, and tip ends of the pair of first links are pivotably coupled to an object installation table through a pair of second coupling shafts; a transmission unit provided in the intermediate table and operable to transmit torque between the first and second links constituting the first and second linkages in both forward and backward directions; and a driving unit provided in the fixed table and operable to drive one of the pair of first links constituting the first linkage to rotate. In the transmission unit, one pulley of a pair of pulleys rotatably supported at the outside of the pair of intermediate shafts is integrally coupled to one of the pair of first links constituting the first linkage, and the other pulley is integrally coupled to one of the pair of second links constituting the second linkage. At this time, the upper and lower belts are partially wound around the pulleys in opposite directions with each other and both ends of the belts are fixed to the pulleys so as to transmit the torque between the pair of pulleys in both forward and backward directions. When the driving unit drives one of the first links of the first linkage to rotate in the forward and backward directions, a driving force is transmitted between a predetermined first and second links constituting the first and second linkages in the transmission unit part. Accordingly, the object installation table disposed at one end of the bottom side of an isosceles triangle formed by the first and second linkages is moved in a straight line shape in the forward and backward directions. In this way, the transportation apparatus linearly transports an object such as a wafer.

At this time, since the transmission unit has a configuration in which the upper and lower belts are partially wound around the pulleys in opposite directions with each other and both ends of the belts are fixed to the pulleys so as to transmit the torque between the pair of pulleys in both forward and backward directions, when the pulleys are allowed to rotate in a predetermined direction to apply tension to one belt in the state where the belts are partially suspended and attached to the pulleys by applying tension thereto, the other belt is loosened so that tension thereof becomes small. As a result, a problem arises in that the tension adjustment of the pair of belts is difficult. Additionally, when tensions of the pair of belts are not appropriate, acceleration abruptly acts on the transported object supported on the object installation table and the transported object deviates from a predetermined position. As a result, a problem arises in that a movement placement of the object is difficult in the subsequent process.
Patent Document 1: Japanese Patent Publication No. 4-331090A

SUMMARY

An object of the invention is to facilitate tension adjustment of the pair of belts constituting the transmission unit provided in a coupling portion of the first and second linkages in the transportation apparatus with the above-described configuration for linearly transporting the object.

In order to achieve the above described object, according to an aspect of the present invention, there is provided a transportation apparatus operable to linearly transport an object, comprising: a first linkage, in which base ends of a pair of first links which have the same length with each other are pivotably coupled to a fixed table through a pair of first coupling shafts, and tip ends of the first links are pivotably coupled to a pair of first intermediate shafts which are fixed to a first intermediate table; a second linkage, in which base ends of a pair of second links which have the same length with the first links are pivotably coupled to the first intermediate shafts, and tip ends of the second links are pivotably coupled to a first installation table of the object through a pair of second coupling shafts; a first driving unit operable to apply torque to one of the first coupling shafts to rotate one of the first links; and a first transmission unit provided in the first intermediate table and operable to transmit the torque from the one of the first links to one of the second links, wherein the transmission unit includes: a pair of pulleys pivotably supported by the first intermediate shafts and fixed to the one of the first links and the one of the second links; and an upper belt and lower belt are partially wound around the pulleys in opposite directions with each other and fixed to the pulleys so as to transmit the torque; wherein one of the pulleys is divided into an upper part fixed with the upper belt and a lower part fixed with the lower belt in an axial direction of the first intermediate shafts.

According to the above-described configuration, one of the pair of pulleys is divided into two parts in the axial direction, and one ends of the pair of belts can be fixed to the divided pulleys, respectively. Accordingly, when the divided pulleys rotate in an opposite direction with each other in the state where the other ends of the pair of belts which are wound in an opposite direction with each other are fixed to deviated positions of a fixed rotation member in the axial direction, respectively, and one ends of the pair of belts are fixed to the divided pulleys, respectively, predetermined tensions are applied to the belts. In this state, one ends of the pair of links are fixed to the divided pulleys. Likewise, since the pulley to which one ends of the pair of belts are fixed is divided into two parts in the axial direction, the tension adjustment of the pair of belts can be individually carried out, thereby facilitating the tension adjustment.

The transportation apparatus may further comprise: a third linkage, in which base ends of a pair of third links which have the same length with each other are pivotably coupled to the fixed table through a pair of third coupling shafts, and tip ends of the third links are pivotably coupled to a pair of second intermediate shafts which are fixed to a second intermediate table;

a fourth linkage, in which base ends of a pair of fourth links which have the same length with the third links are pivotably coupled to the second intermediate shafts, and tip ends of the fourth links are pivotably coupled to a second installation table of the object through a pair of second coupling shafts; a second driving unit operable to apply torque to one of the third coupling shafts to rotate one of the third links; and a second transmission unit provided in the second intermediate table and operable to transmit the torque from the one of the third links to one of the fourth links, wherein the first installation table may be formed so as not to have a conflict with the second installation table while transporting the object.

According to the above-described configuration, since two linear transportation units are simultaneously operated in different operation spaces without conflicting with each other, thereby realizing a severalfold increase in the transportation capability of the object.

A first attachment portion for attaching a tension applying member may be formed on the upper part of the divided pulley and a second attachment portion for attaching a tension applying member may be formed on the lower part of the divided pulley.

According to the above-described configuration, when the tension applying bar is inserted into the insertion holes of the divided pulleys, torque is easily applied to the divided pulleys, thereby facilitating the tension adjustment of the belts.

According to another aspect of the present invention, there is provided a method for adjusting tensions of the upper and lower belts of the transmission unit, comprising: attaching a tension applying member to the first attachment portion; attaching another tension applying member to the second attachment portion; and connecting the tension applying members by a spring, thereby adjusting the tensions of the upper and lower belts.

According to the above-described configuration, since the tensions of the belts become large in proportion to the strength of the spring connecting the tension applying members to each other, the tensions of the belts can be adjusted and the tensions of the belts can be set to be identical with each other by selecting a spring having a different spring constant. Additionally, since the rotation motions acting on the other pulleys are offset by the tensions of the pair of belts, it is not necessary to retard the rotation motions of the other pulleys. Likewise, since the divided pulleys are stopped in the state where the tensions of the pair of belts are adjusted, it is possible to easily fix one ends of the pair of links to the divided pulleys in the state where the tension applying members are connected to each other by the spring.

According to the invention, since one of the pair of pulleys is divided into two parts in the axial direction, the tension adjustment of the pair of belts, that is, the belts which are partially wound around the pair of pulleys in an opposite direction with each other and of which both ends are fixed to the pulleys can be individually carried out, thereby facilitating the tension adjustment.

DETAILED DESCRIPTION OF THE EMBODIMENTS

Figure 1:
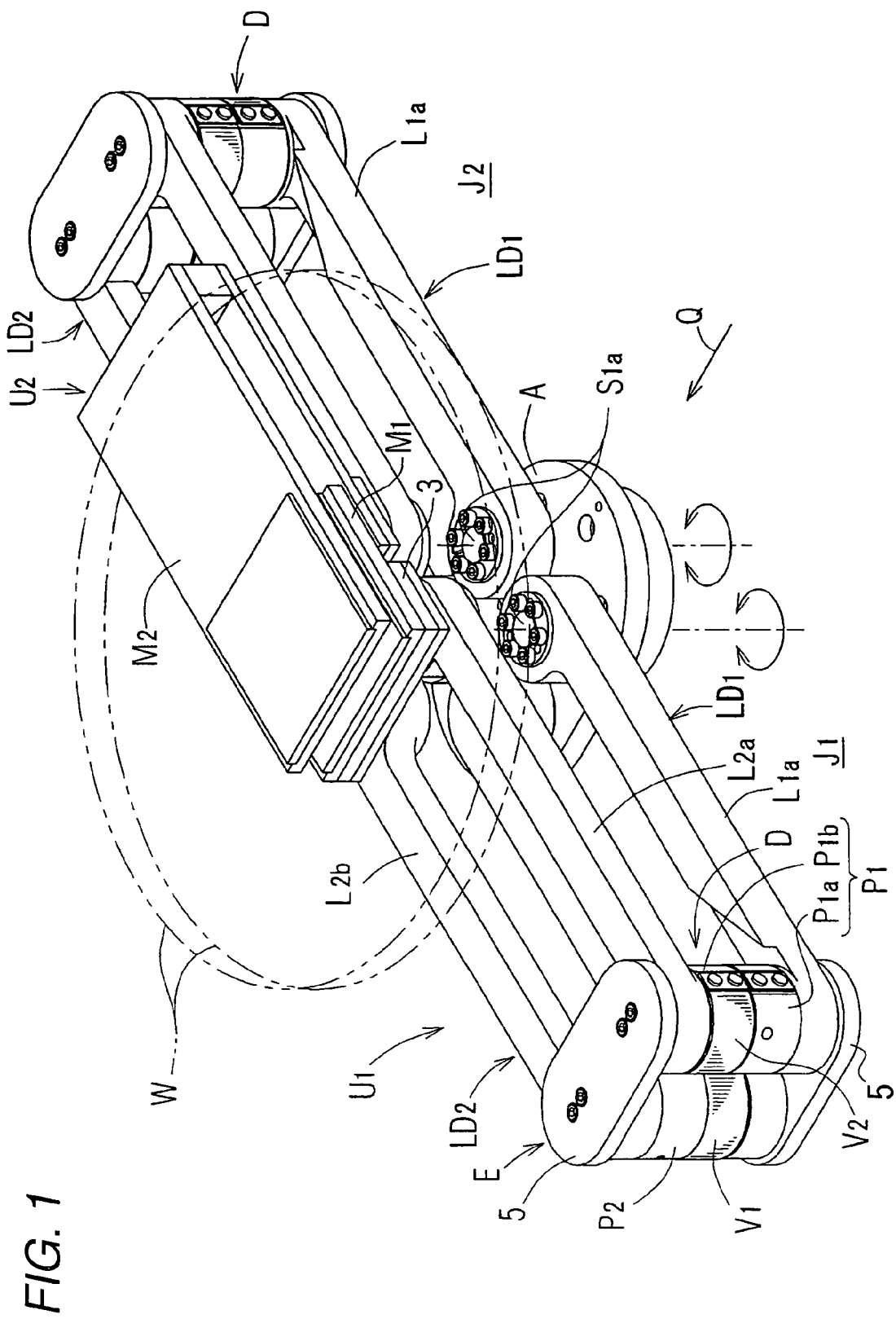
FIG. 1 is an overall perspective view illustrating a transportation apparatus according to an embodiment in the state where a first linkage LD1 overlaps with a second linkage LD2 when viewed from the top.
Figure 2:
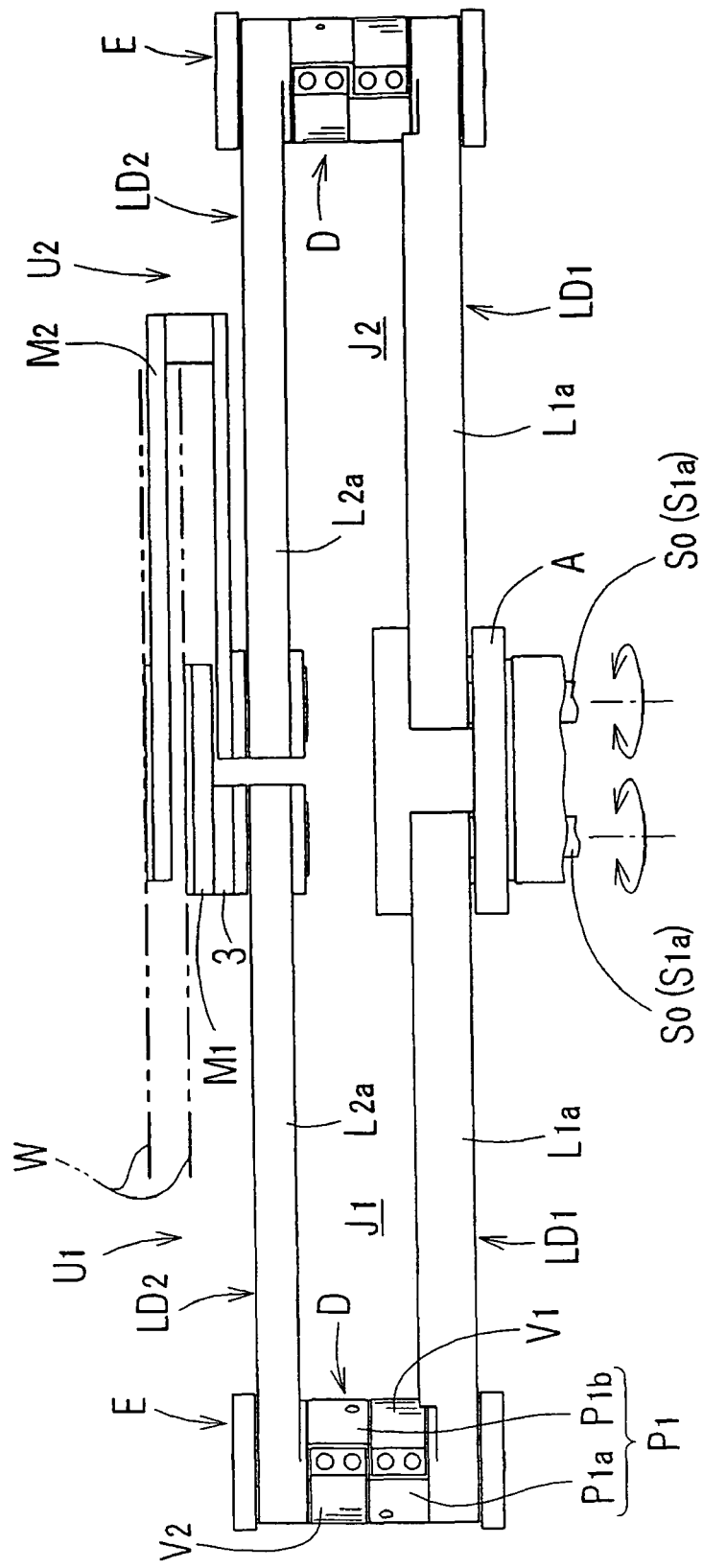
FIG. 2 is a side view illustrating the transportation apparatus in the state where the first linkage LD1 overlaps with the second linkage LD2 when viewed from the top.
Figure 3:
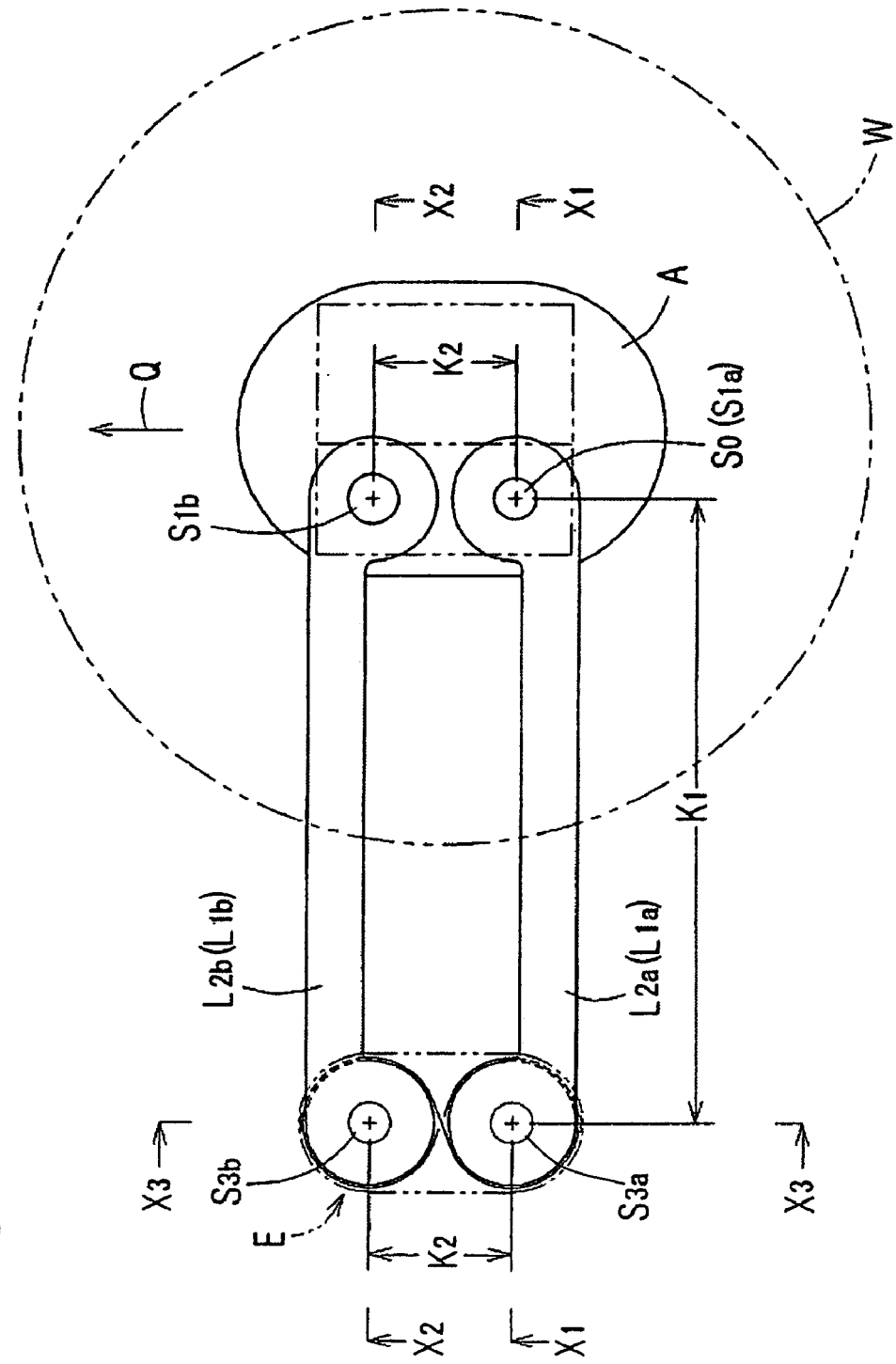
FIG. 3 is a schematic top view illustrating a linear transportation unit U1 according to the embodiment of the invention.
Figure 4:
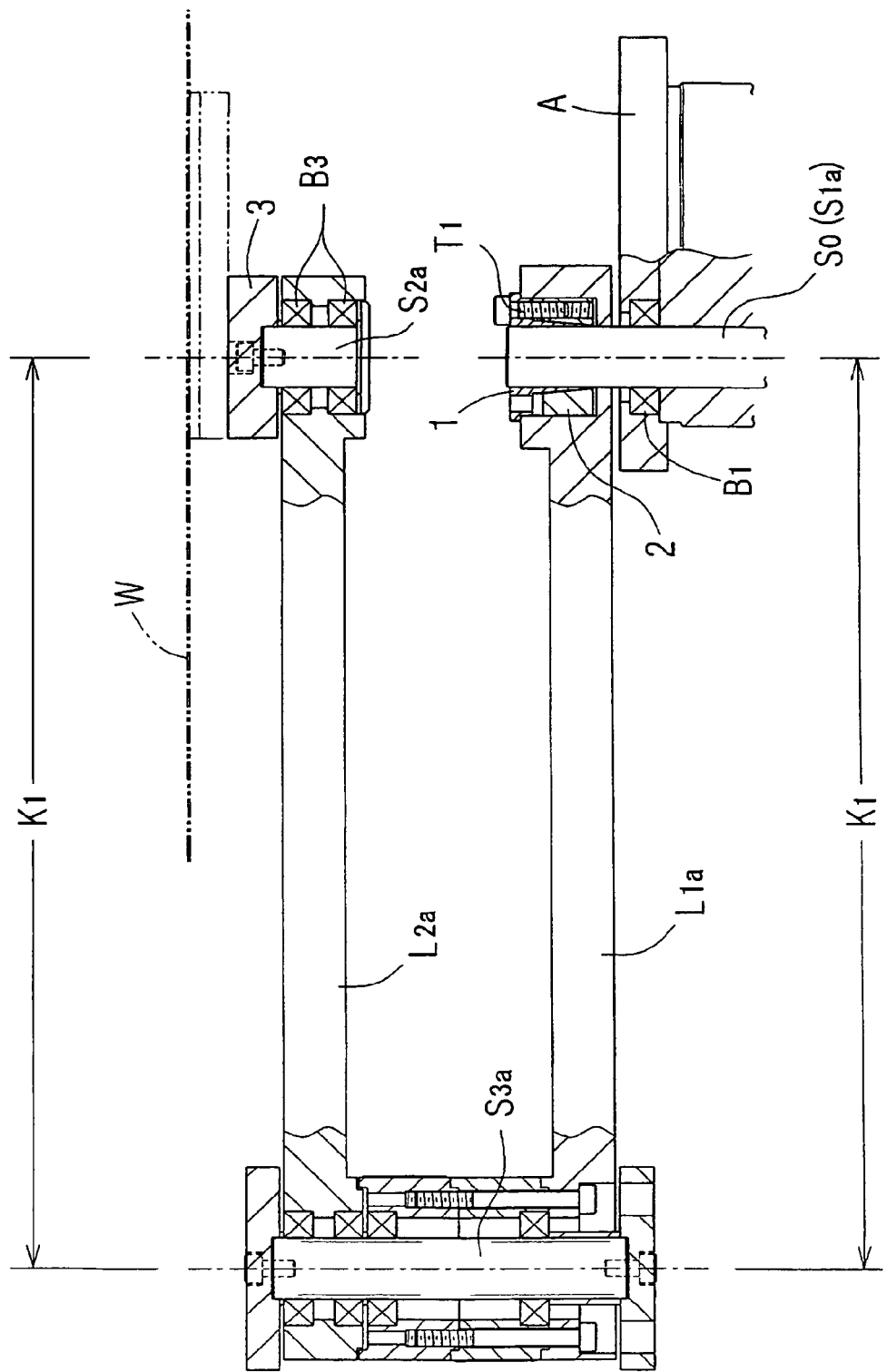
FIG. 4 is a sectional view taken along the line X1-X1 shown in FIG. 3.
Figure 5:
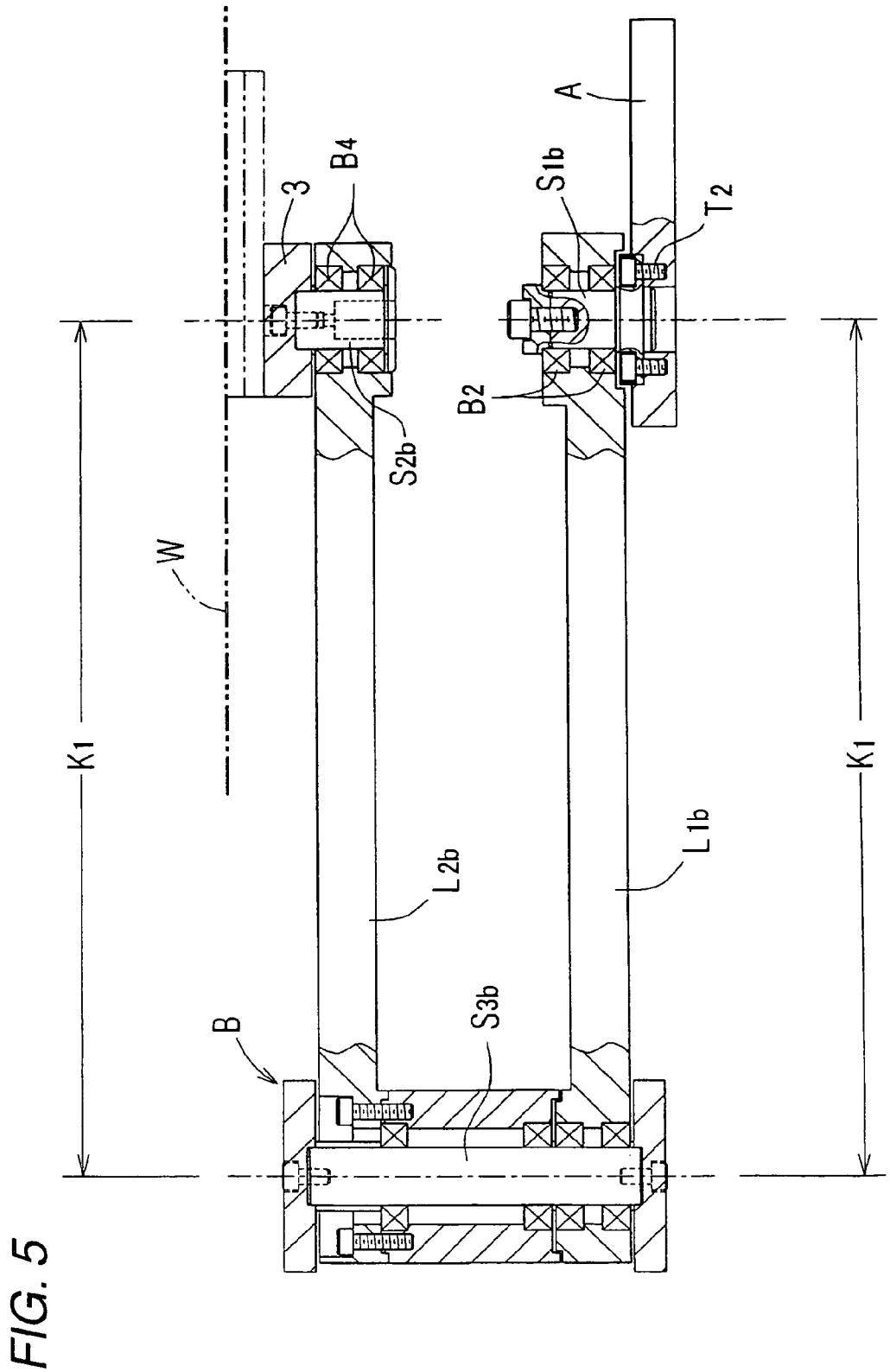
FIG. 5 is a sectional view taken along the line X2-X2 shown in FIG. 3.

Hereinafter, an exemplary embodiment of the invention will be described in detail. First, an overall configuration of a transportation apparatus for linearly transporting an object will be simply described with reference to FIGS. 1 to 9. Then, parts related to the invention will be described in detail. As shown in FIGS. 1 and 2, the transportation apparatus according to the embodiment includes two linear transportation units U1 and U2 having the same basic configuration with each other. Each of the linear transportation units U1 and U2 is configured to linearly transport a wafer (object) W in an arrow direction Q by a link motion. At this time, in each of link operation spaces J1 and J2 at both sides of a fixed table A, first links L1$a$ and L1$b$ do not interfere with second links L2$a$ and L2$b$. Also, the transported wafers (object) W do not interfere with each other. Accordingly, in the description hereinafter, only one linear transportation unit U1 will be described, while only different points of the other linear transportation unit U2 which are different from the one linear transportation unit U1 will be described.

The linear transportation unit U1 is configured such that a first linkage LD1 and a second linkage LD2 are coupled to each other through a transmission unit D. The first linkage LD1 is configured such that base ends of a pair of first links L1$a$ and L1$b$ having the same length with each other are pivotably coupled to the fixed table A through a pair of first coupling shafts S1$a$ and S1$b$, respectively, and the tip ends of the pair of first links L1$a$ and L1$b$ are pivotably coupled to a pair of intermediate shafts S3$a$ and S3$b$ of an intermediate table E, respectively. The first coupling shaft S1$a$ also serves as a drive shaft S0, and the drive shaft S0 (first coupling shaft S1$a$) is rotatably supported by the fixed table A through a bearing B1. At this time, the drive shaft S0 (first coupling shaft S1$a$) and the first link L1$a$ are integrally coupled to each other by a chock 1, a chock receiving portion 2, and bolts T1 (see FIG. 4). The first coupling shaft S1$b$ is fixed to the fixed table A through bolts T2, and the base end of the first link L1$b$ is pivotably coupled to the first coupling shaft S1$b$ through a pair of bearings B2 (see FIG. 5). Additionally, the second linkage LD2 is configured such that base ends of a pair of second links L2$a$ and L2$b$ having the same length with each other are pivotably coupled to the pair of intermediate shafts S3$a$ and S3$b$, respectively, and the tip ends of the pair of the second links L2$a$ and L2$b$ are pivotably coupled to a pair of second coupling shafts S2$a$ and S2$b$ fixed to the bottom surface of a tip-end link plate 3 through a pair of upper and lower bearings B3 and B4, respectively (see FIGS. 4 and 5). A wafer installation table M1 is provided on the top surface of the tip-end link plate 3. Additionally, each length of the first links L1a and L1b and the second links L2a and L2b is denoted by K1.

Figure 6:
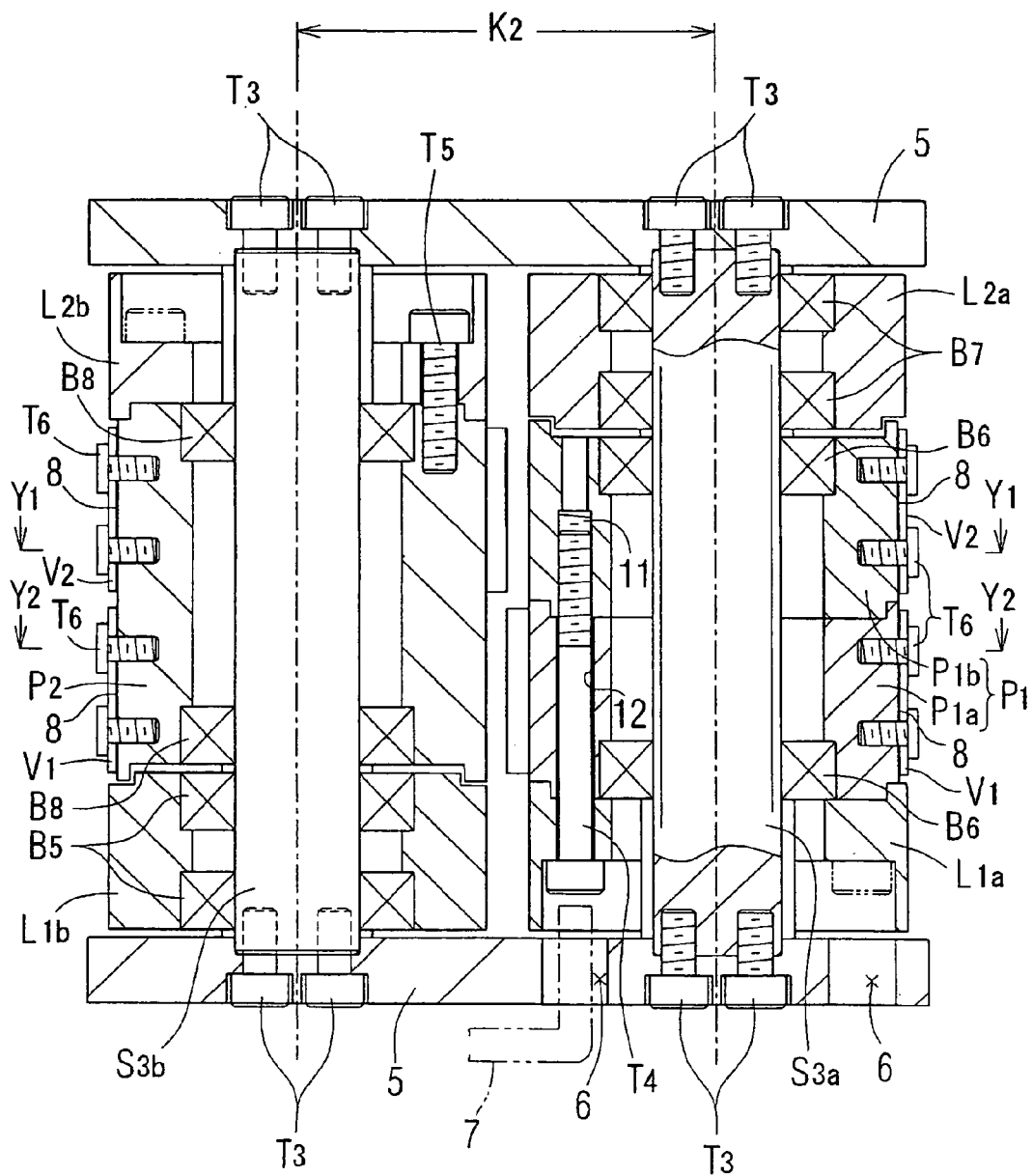
FIG. 6 is a sectional view taken along the line X3-X3 shown in FIG. 3.
Figure 9:
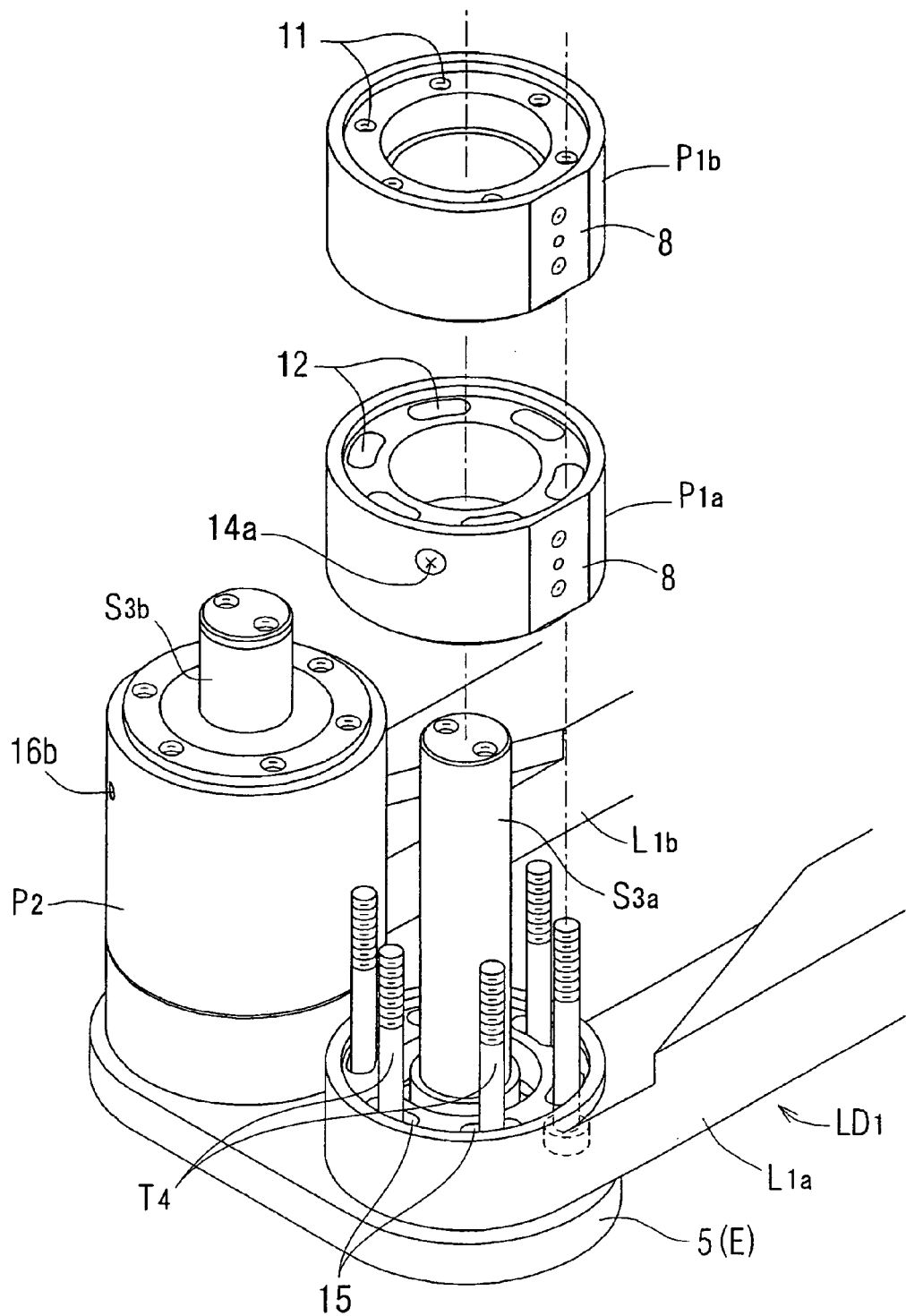
FIG. 9 is an exploded perspective view illustrating an intermediate table E according to the embodiment of the invention.

When the first linkage LD1 performs a parallel link motion in the link operation space J1 by the torque of the first coupling shaft S1a serving as the drive shaft S0, the pair of first links L1a and L1b pivot about the intermediate shafts S3a and S3b with respect to the intermediate table E. The transmission unit D attached to the intermediate table E operates the second linkage LD2 by using a rotation of the pair of first links L1a and L1b. As shown in FIGS. 6 and 9, the transmission unit D is attached to the intermediate table E in the manner that the pair of upper and lower intermediate link plates 5 are coupled to each other through the pair of left and right intermediate shafts S3a and S3b and bolts T3. Gaps K2 of the pair of left and right intermediate shafts S3a and S3b, the pair of first coupling shafts S1a and S1b, and the pair of second coupling shafts S2a and S2b are the same as one another. The pair of first links L1a and L1b constituting the first linkage LD1 are pivotably supported by the bottom portions of the intermediate shafts S3a and S3b of the intermediate table E, respectively.

That is, the first link L1b of the first linkage LD1 is directly and pivotably coupled to the bottom portion of the intermediate shaft S3b through a pair of upper and lower bearings B5. The first link L1a is disposed below a first pulley P1 which is rotatably supported by the intermediate shaft S3a through a pair of upper and lower bearings B6, and is integrally coupled to the first pulley P1 through a plurality of bolts T4 so as to be pivotably supported by the intermediate shaft S3a. In the same manner, the second link L2a of the second linkage LD2 is directly and pivotably coupled to the top portion of the intermediate shaft S3a through a pair of upper and lower bearings B7. The second link L2b is disposed above a second pulley P2 which is rotatably supported by the intermediate shaft S3b through a pair of upper and lower bearings B8, and is integrally coupled to the second pulley P2 through a plurality of bolts T5 so as to be pivotably supported by the intermediate shaft S3b.

The first and second pulleys P1 and P2 are of a cylindrical shape, but it is different in that the second pulley P2 is formed in a single body and the first pulley P1 is divided into two parts in an axial direction. The second pulley P2 is integrally coupled to the base end of the second link L2b of the second linkage LD2 through a plurality of bolts T5, but the first pulley P1 having two parts is configured such that the long bolts T4, which are rotated by a bolt rotating tool 7 inserted through a tool insertion through-hole 6 formed in the lower intermediate link plate 5 of the intermediate table E, integrally connects the pulleys P1a and P1b to the tip end of the first link L1a of the first linkage LD1.

Figure 7:
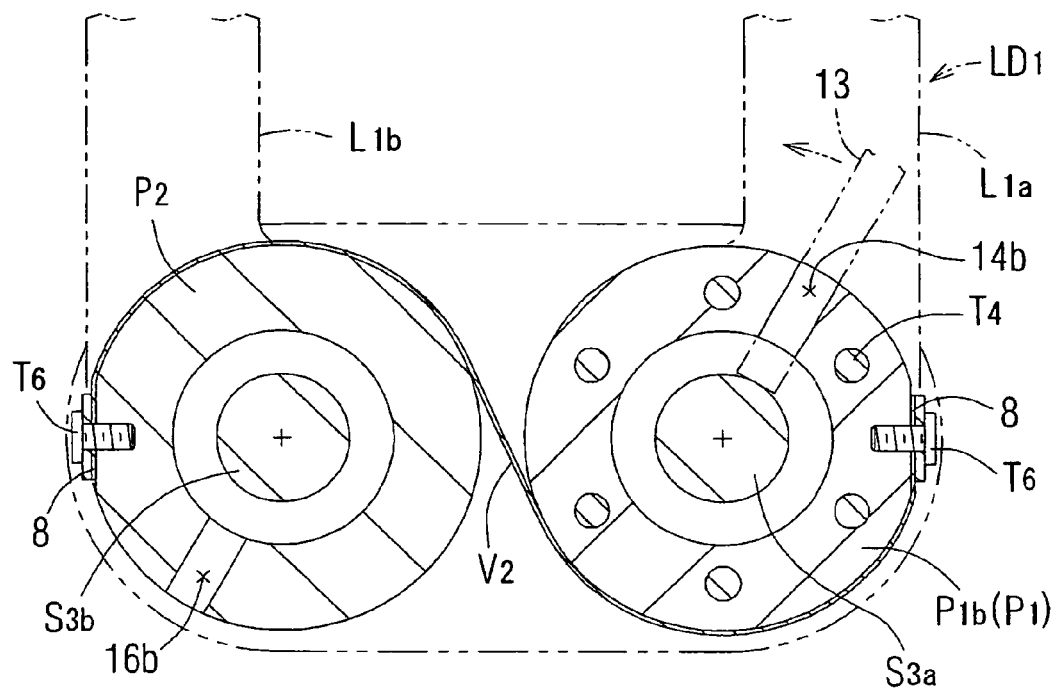
FIG. 7 is a sectional view taken along the line Y1-Y1 shown in FIG. 6.
Figure 8:
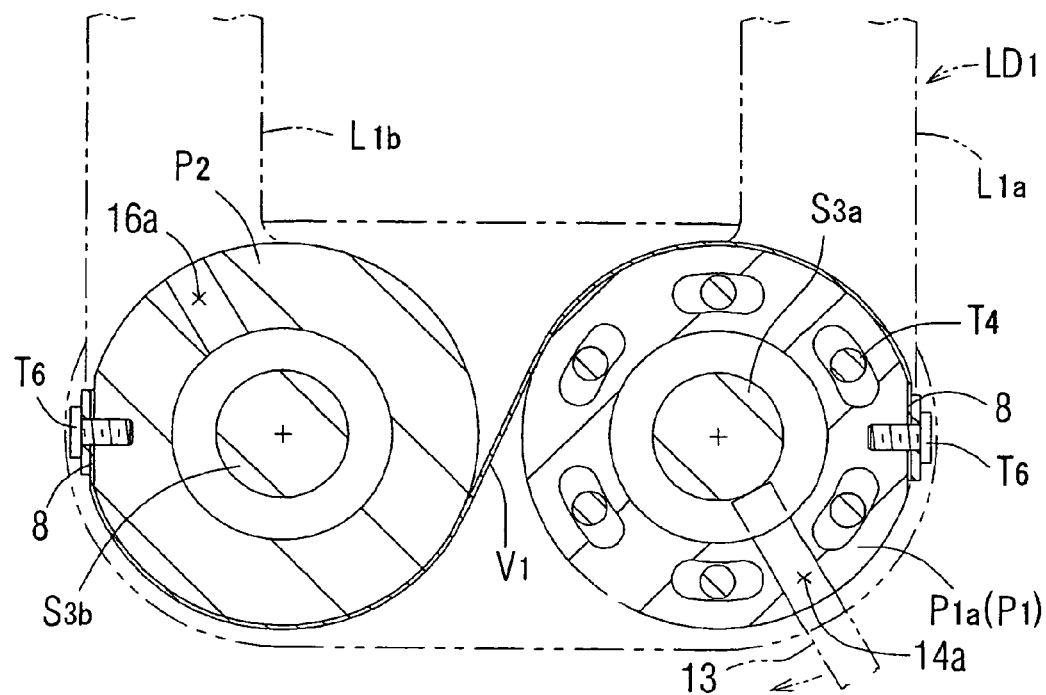
FIG. 8 is a sectional view taken along the line Y2-Y2 shown in FIG. 6.

Additionally, as shown in FIGS. 6 to 8, first and second belts V1 and V2 are partially wound around the pulleys P1a and P1b constituting the first pulley P1 and the second pulley P2 so that the winding angles are substantially at 180° and the winding directions are opposite to each other. Both ends of the belts V1 and V2 are fixed to flat portions 8 of the divided pulleys P1a and P1b of the first pulley P1 and the second pulley P2 through a plurality of bolts T6.

Accordingly, when the first coupling shaft S1a serving as the drive shaft S0 is driven to rotate so that an intersection angle between the first links L1a and L1b of the first linkage LD 1 and the second links L2a and L2b of the second linkage LD2 becomes small, as shown in FIG. 7, a torque of the first links L1a and L1b is transmitted to the second links L2a and L2b by the upper second belt V2. At this time, since the first links L1a and L1b rotate in the counterclockwise direction with respect to the intermediate table E when viewed from the top, the second links L2a and L2b rotate in the clockwise direction with respect to the intermediate table E when viewed from the top. Conversely, when the intersection angle between the first links L1a and L1b of the first linkage LD1 and the second links L2a and L2b of the second linkage LD2 becomes large, as shown in FIG. 8, the torque of the first links L1a and L1b is transmitted to the second links L2a and L2b by the lower first belt V1.

Figure 11:
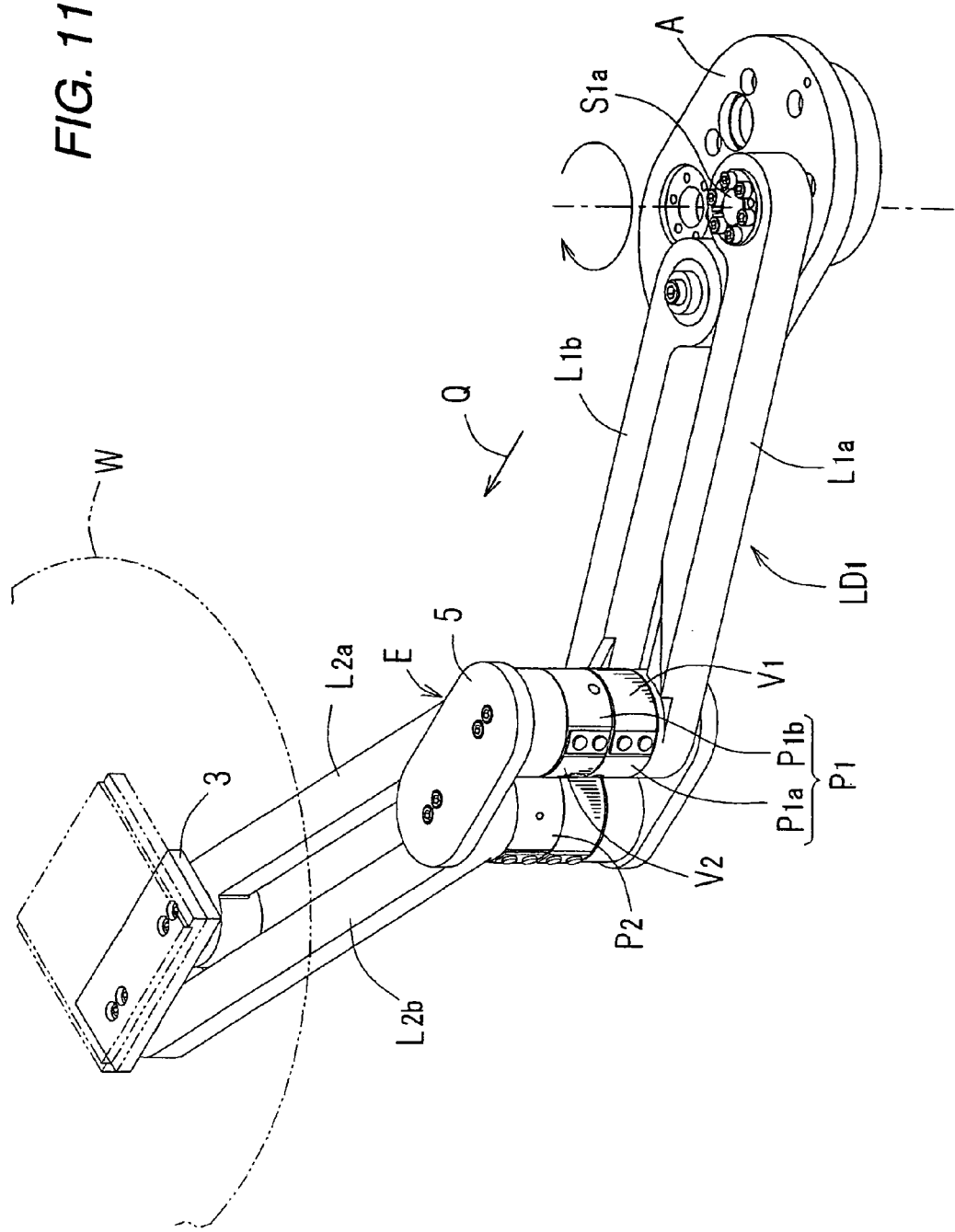
FIG. 11 is a perspective view illustrating a state where the linear transportation unit U1 is being operated.
Figure 12:
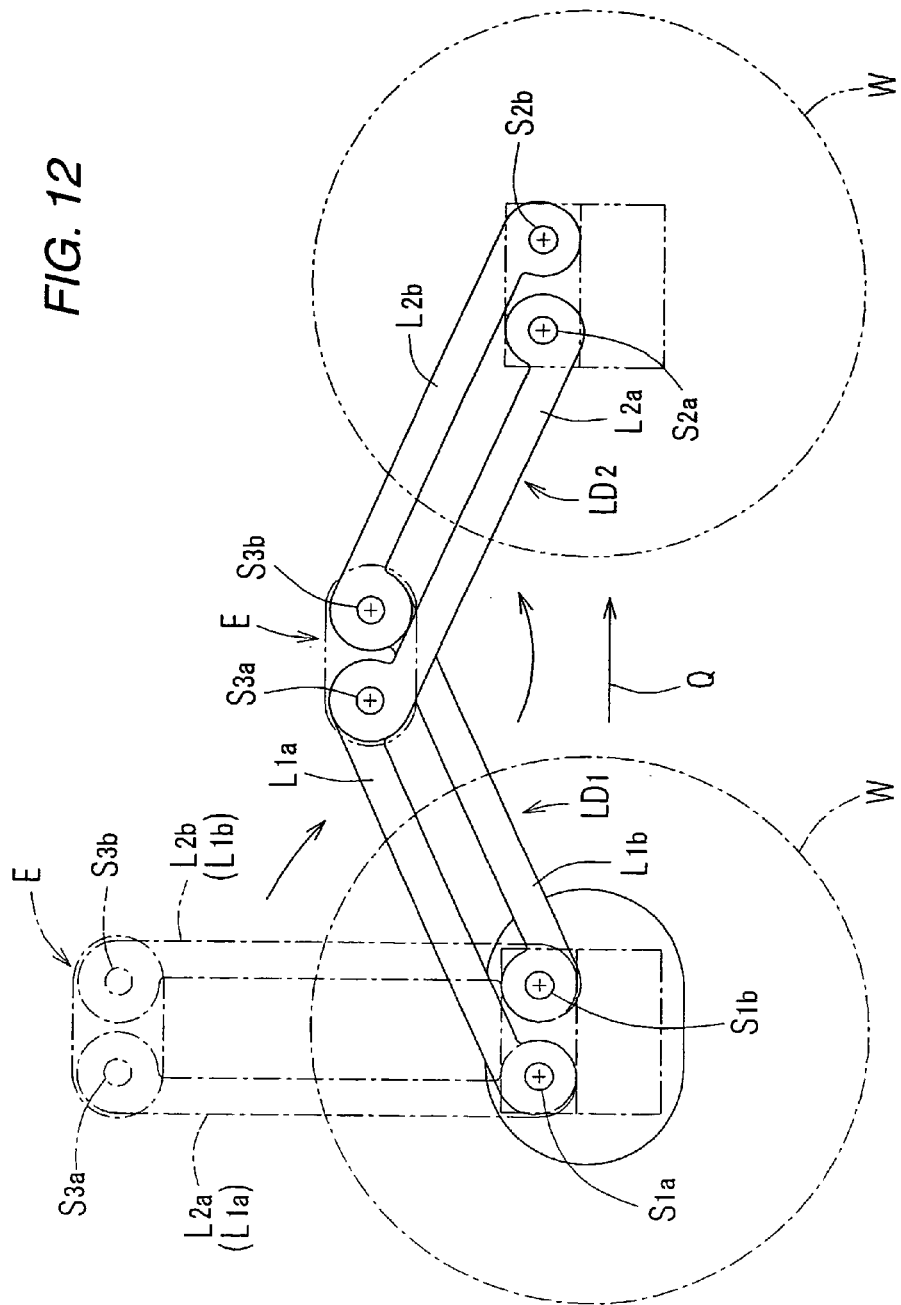
FIG. 12 is a top view illustrating a state where the linear transportation unit U1 is operated.
Figure 13:
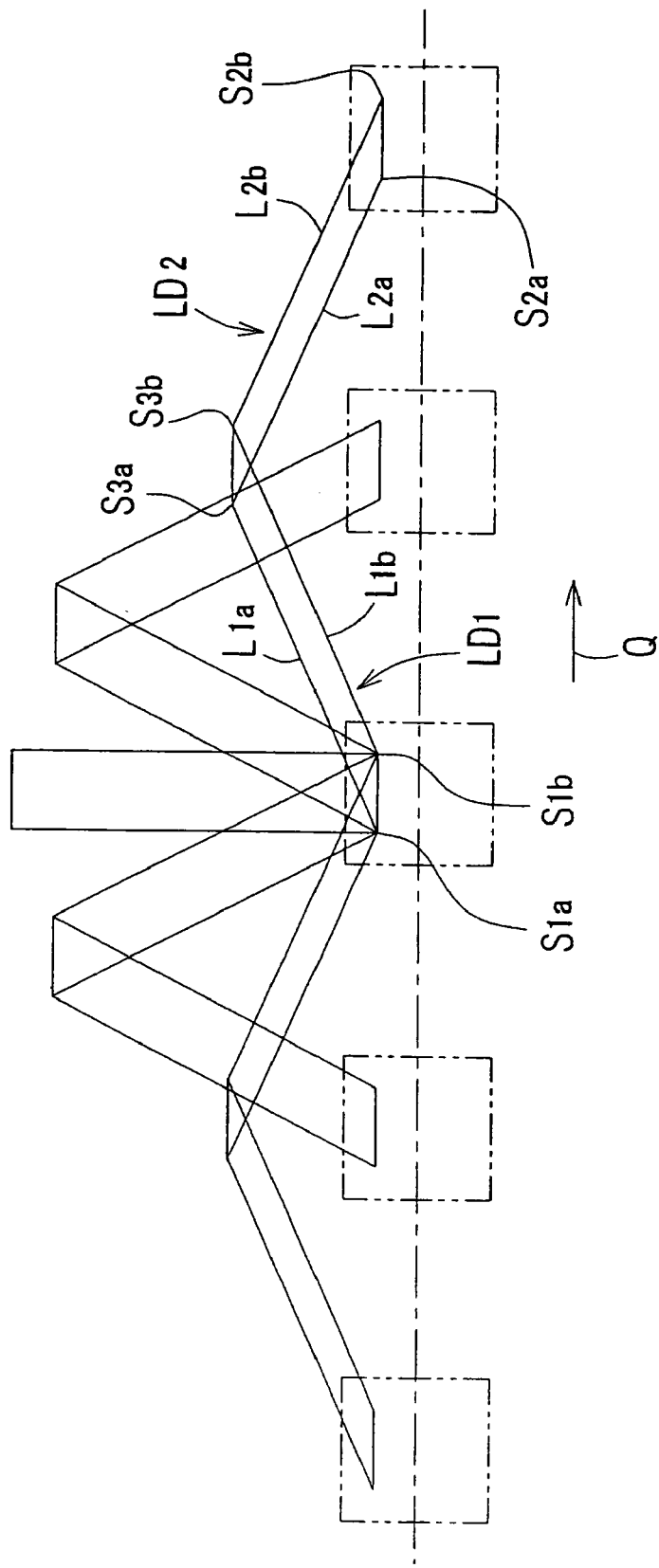
FIG. 13 is a schematic view illustrating a state where an object is transported by the linear transportation unit U1.

Additionally, since the length of the pair of first links L1a and L1b is the same as that of the pair of second link L2a and L2b, as shown in FIGS. 11 to 13, the pair of first links L1a and L1b are disposed on the right side of the pair of second links L2a and L2b. Further, when the first coupling shaft S1a serving as the drive shaft S0 rotates in the clockwise direction when viewed from the top in the state where the intersection angle between the pair of first links L1a and L1b and the pair of second links L2a and L2b is maximum, a wafer installation table M1 that is normally positioned at one end of the bottom side of an isosceles triangle linearly moves from the left side to the right side so as to linearly transport the wafer W. Additionally, after the movement placement of the wafer W ends, it is possible to return the wafer installation table M1 to a wafer extracting position by rotating the first coupling shaft S1a serving as the drive shaft S0 in the counterclockwise direction when viewed from the top so that the pair of first links L1a and L1b and the pair of second links L2a and L2b move in a manner opposite to that upon transporting the wafer.

In this way, the driving force of the second linkage LD2 is dependent on the driving force that is transmitted from the first linkage LD1 through the transmission unit D attached to the intermediate table E when the link motion of the first and second linkages LD1 and LD2 constituting the linear transportation unit U1 is carried out. For this reason, when the tensions of the first and second belts V1 and V2 constituting the transmission unit D are too large, it is difficult to smoothly perform the power transmission. In the worst case, malfunctions of the first and second linkages LD1 and LD2 occur. Conversely, when the tensions thereof are too small, "large slacks" of the first and second belts V1 and V2 occur. For this reason, the belts start to abruptly operate after a short-time non-operation state at the time of operating the belts which are in the stop state. At this time, a large force acts on the wafer W which is a transported object, and thus the wafer W moves slightly with respect to the wafer installation table M1. As a result, a problem arises in that the movement placement of the wafer W cannot be smoothly carried out or the movement placement thereof is not possible. Accordingly, it is necessary to appropriately set the tensions of the first and second belts V1 and V2.

As shown in FIGS. 6 and 9, the first pulley P1 includes the pair of upper and lower divided pulleys P1a and P1b which are divided into two parts in the axial direction. One (upper) divided pulley P1b is provided with a plurality of female screws 11 which are arranged in the circumferential direction with a predetermined gap interposed therebetween. The other (lower) divided pulley P1a is provided with a plurality of insertion through-holes 12 with a long hole shape which are formed in each corresponding position of the female screws 11 of the divided pulley P1a. Additionally, as shown in FIGS. 7 and 8, since the first and second belts V1 and V2 are not wound based on the flat portions 8 of the divided pulleys P1a and P1b, insertion through-holes 14a and 14b for a tension applying bar, through which the tip ends of the tension applying bars 13 are inserted, are formed at opposite positions in the radius direction.

The first and second upper and lower pulleys P1a and P1b are temporarily coupled to the first link L1a by the bolts T4 which are inserted through a plurality of bolt insertion through-holes 15 (see FIG. 9) with a long hole shape formed in the tip end of the first link L1a in the circumferential direction so that the divided pulleys P1a and P1b are rotatable with the first link L1a. In this state, as depicted by the chain double-dashed line shown in FIG. 7, the tension of the second belt V2 is set in the manner that the tension applying bar 13 is inserted through the insertion through-hole 14b for the tension applying bar of the upper divided pulley P1b to apply torque so that the divided pulley P1b rotates in the counter-clockwise direction when viewed from the top. Also, as depicted by the chain double-dashed line shown in FIG. 8, the tension of the first belt V1 is set in the manner that the tension applying bar 13 is inserted through the insertion through-hole 14a for the tension applying bar of the lower divided pulley P1a to apply torque so that the divided pulley P1a rotates in the clockwise direction when viewed from the top. Subsequently, when the bolts T4 are fastened by the bolt rotating tool 7 which is inserted through the tool insertion through-hole 6 formed in the intermediate link plate 5 of the intermediate table E, the divided pulleys P1a and P1b are integrally coupled to the first link L1a, thereby setting the tensions of the first and second belts V1 and V2.

As described above, the reason why the tensions of the belts V1 and V2 can be adjusted in the aforementioned manner is because the insertion through-holes 15 which are formed in the tip end of the first link L1a and the insertion through-holes 12 which are formed in the divided pulley P1a in the axial direction are formed in a long hole shape in the circumferential direction so that the fixed positions of the divided pulleys P1a and P1b with respect to the first link L1a can be finely adjusted in the circumferential direction. Additionally, it is necessary to fix the second pulley P2 so as not to be pivotable upon adjusting the tensions of the belts V1 and V2. Accordingly, the second links L2a and L2b may be fixed so as not to be pivotable, or a bar member (not shown) may be inserted into one of a pair of fixed holes 16a and 16b which are formed in deviated positions in the radius direction along the circumferential direction of the second pulley P2 so as to fix the bar member thereto.

Figure 10:
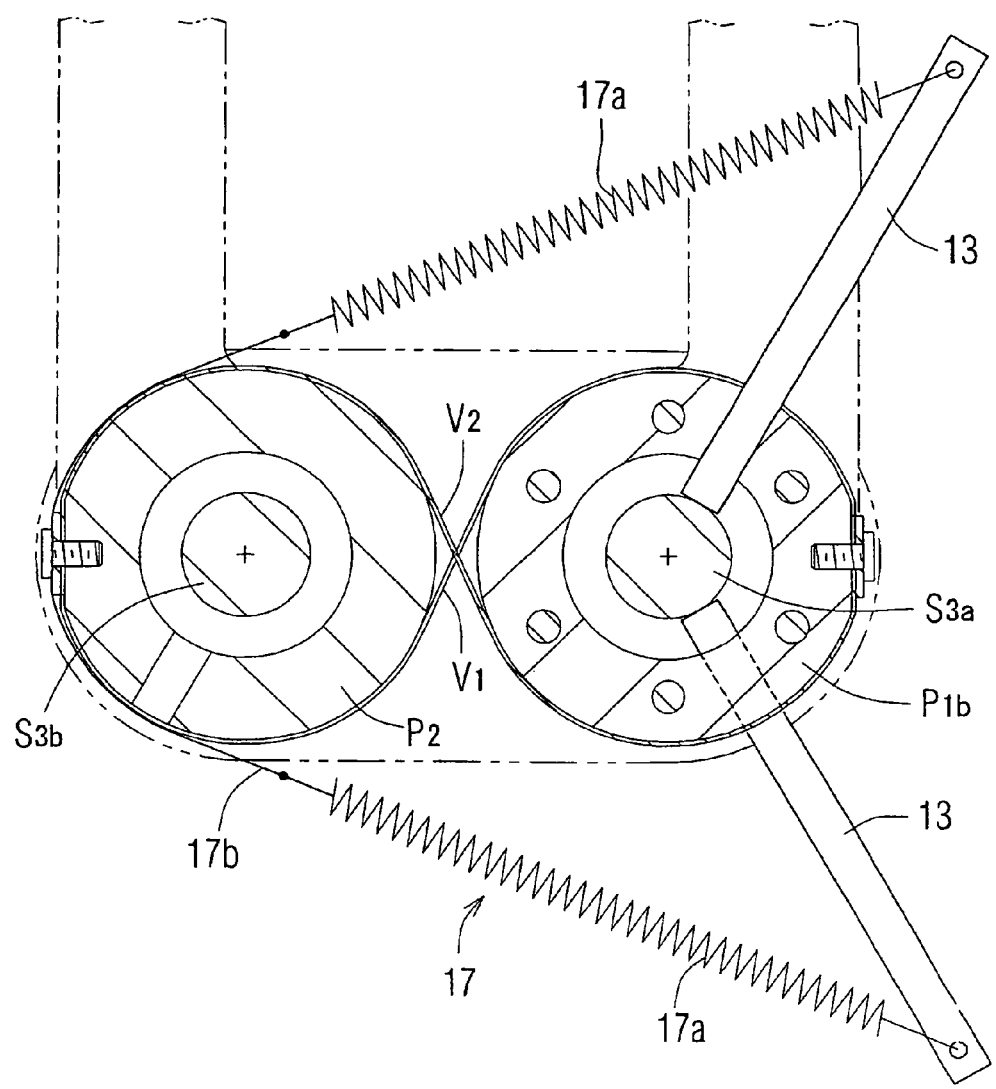
FIG. 10 is a schematic view illustrating a method for adjusting tensions of a first belt V1 and a second belt V2 by use of a tension spring 17.

Additionally, as shown in FIG. 10, it is possible to adjust the tensions of the first and second belts V1 and V2 in the manner that a tension spring 17 is wound around the pulley P2 of the other second pulley P2 and then both ends of the tension spring 17 are suspended on the tip ends of the tension applying bar 13 in the state where the tension applying bars 13 are inserted through the insertion through-holes 14a and 14b for the tension applying bar of the divided pulleys P1a and P1b. In this manner, when the tensions of the belts V1 and V2 are adjusted by the tension spring 17, the tensions of the belts V1 and V2 are precisely set by a strength (spring constant) of the tension spring 17, and the tensions of the belts V1 and V2 are identical with each other. Also, the torque acting on the second pulley P2 is offset. Accordingly, it is advantageous in that the second pulley P2 does not rotate without retarding the rotation thereof. Additionally, it is desirable to configure the tension spring 17 such that a spring portion 17a constitutes a linear arrangement part and a non-spring portion 17b constitutes a part partially winding around the second pulley P2.

The transportation apparatus according to the embodiment includes two linear transportation units U1 and U2 having the wafer installation tables M1 and M2 which are different from each other. That is, as shown in FIGS. 1 and 2, the wafer installation table M2 of the linear transportation unit U2 is formed in a long U shape when viewed from the side. In the state where the linear transportation units U1 and U2 are positioned in a straight line shape, a part of the wafer installation table M1 of the other linear transportation unit U1 and the wafer W placed on the wafer installation table M1 can be received inside the wafer installation table M2. With such a configuration, the linear transportation units U1 and U2 operate in different link operation spaces J1 and J2, respectively, and thus even in the center of the transportation course of the wafer W, the wafer installation tables M1 and M2 and the wafers W placed on the wafer installation tables M1 and M2 do not conflict with each other, respectively. Accordingly, two linear transportation units U1 and U2 can be simultaneously operated in the different link operation spaces J1 and J2, thereby realizing a severalfold increase in the transportation capability of the wafer W.

Further, one of the pair of pulleys P1 and P2 may be configured to be divided into two parts in the axial direction, and thus it is possible to configure the second pulley P2 to be divided into two parts.

What is claimed is:

1. A transportation apparatus operable to linearly transport an object, comprising:
   a first linkage, in which base ends of a pair of first links which have the same length with each other are pivotably coupled to a fixed table through a pair of first coupling shafts, and tip ends of the first links are pivotably coupled to a pair of first intermediate shafts which are fixed to a first intermediate table;
   a second linkage, in which base ends of a pair of second links which have the same length with the first links are pivotably coupled to the first intermediate shafts, and tip ends of the second links are pivotably coupled to a first installation table of the object through a pair of second coupling shafts;
   a first driving unit operable to apply torque to one of the first coupling shafts to rotate one of the first links; and
   a first transmission unit provided in the first intermediate table and operable to transmit the torque from the one of the first links to one of the second links,
   wherein the transmission unit includes:
      a pair of pulleys pivotably supported by the first intermediate shafts and fixed to the one of the first links and the one of the second links; and
      an upper belt and lower belt are partially wound around the pulleys in opposite directions with each other and fixed to the pulleys so as to transmit the torque;
   wherein one of the pulleys is divided into an upper part fixed with the upper belt and a lower part fixed with the lower belt in an axial direction of the first intermediate shafts,
   wherein another of the pulleys is formed in a single body, and
   wherein the divided pulley permits a tension of the upper belt and a tension of the lower belt to be adjusted by movement of the upper part and the lower part, respectively, of the divided pulley in a circumferential direction.

2. The transportation apparatus as set forth in claim 1, further comprising:
   a third linkage, in which base ends of a pair of third links which have the same length with each other are pivotably coupled to the fixed table through a pair of third coupling shafts, and tip ends of the third links are pivotably coupled to a pair of second intermediate shafts which are fixed to a second intermediate table;
   a fourth linkage, in which base ends of a pair of fourth links which have the same length with the third links are pivotably coupled to the second intermediate shafts, and tip ends of the fourth links are pivotably coupled to a second installation table of the object through a pair of second coupling shafts;

a second driving unit operable to apply torque to one of the third coupling shafts to rotate one of the third links; and a second transmission unit provided in the second intermediate table and operable to transmit the torque from the one of the third links to one of the fourth links, wherein the first installation table is formed so as not to have a conflict with the second installation table while transporting the object.

3. The transportation apparatus as set forth in claim 1, wherein a first attachment portion for attaching a first tension applying member is formed on the upper part of the divided pulley and a second attachment portion for attaching a second tension applying member is formed on the lower part of the divided pulley.

4. A method for adjusting tensions of the upper and lower belts of the transmission unit as set forth in claim 3, comprising:

attaching the first tension applying member to the first attachment portion;

attaching the second tension applying member to the second attachment portion; and partially winding a tension spring around the other, single body pulley and connecting opposite ends of the tension spring to the first tension applying member and the second tension applying member, respectively, thereby adjusting the tensions of the upper and lower belts.

* * * * *